United States Patent [19]
Iniewski et al.

[11] Patent Number: 5,910,874
[45] Date of Patent: *Jun. 8, 1999

[54] GATE-COUPLED STRUCTURE FOR ENHANCED ESD INPUT/OUTPUT PAD PROTECTION IN CMOS ICS

[75] Inventors: Kris Iniewski; Marek Syrzycki, both of Coquitlam, Canada

[73] Assignee: PMC-Sierra Ltd., Burnaby, Canada

[ * ] Notice: Under 35 U.S.C. 154(b), the term of this patent shall be extended for 2 days.

[21] Appl. No.: 08/866,120

[22] Filed: May 30, 1997

[51] Int. Cl.$^6$ ....................................... H02H 9/00
[52] U.S. Cl. ............................. 361/56; 361/111; 361/119
[58] Field of Search ................................ 361/56, 91, 111, 361/117, 118, 119, 127

[56] References Cited

U.S. PATENT DOCUMENTS 5,400,202  3/1995  Metz et al. ................................. 361/56

*Primary Examiner*—Jeffrey Gaffin
*Assistant Examiner*—Stephen Jackson
*Attorney, Agent, or Firm*—Pascal & Associates

[57] ABSTRACT

An electrostatic discharge circuit comprising a static discharge input node, a first NMOS FET having its drain connected to the input node and its source and substrate connected to Vss, a first CMOS inverter comprised of a first PMOS FET and a second NMOS FET having the source and substrate of the first PMOS FET connected to the input node, the drain of the first PMOS FET connected at a junction to the drain of the second NMOS FET, and the source of the second NMOS FET connected to Vss, and the gates of the first PMOS FET and of the second NMOS FET connected to Vdd and the junction connected to the gate of the first NMOS FET.

7 Claims, 5 Drawing Sheets

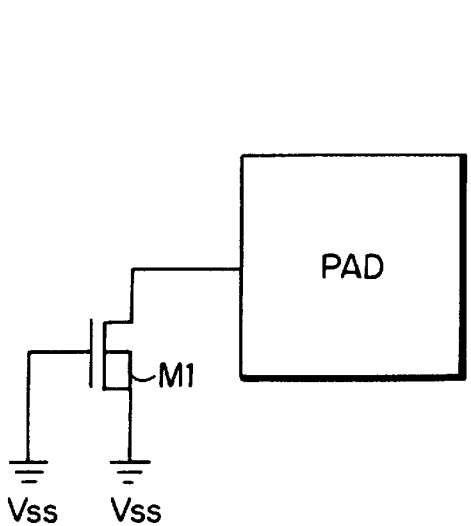
PRIOR ART
FIG. IA
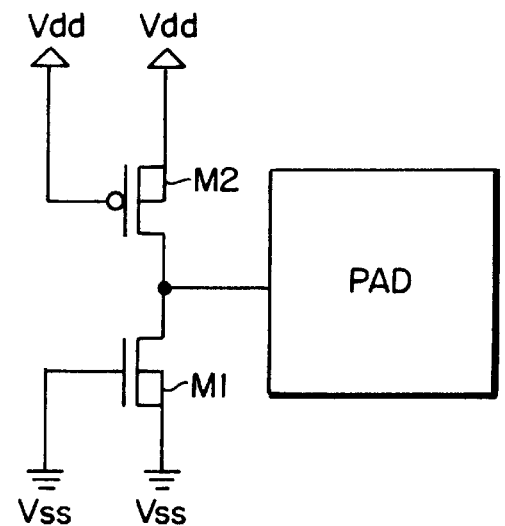
PRIOR ART
FIG. IB
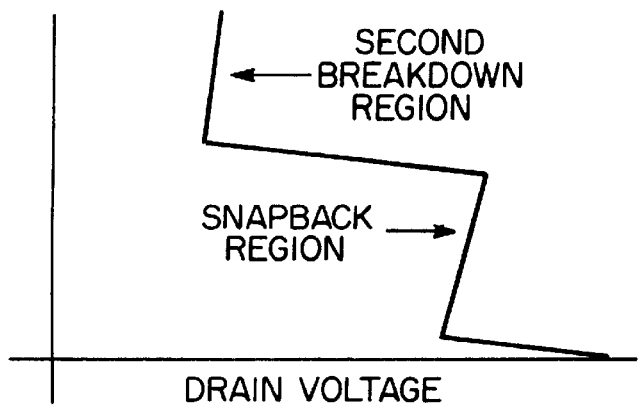
PRIOR ART
FIG. 2A
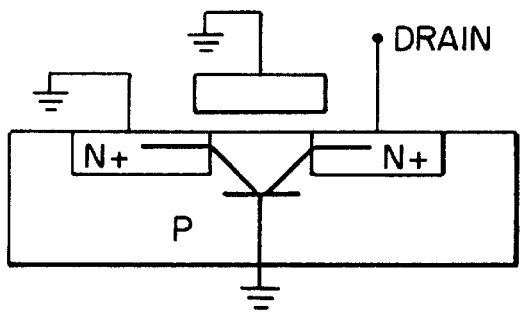
PRIOR ART
FIG. 2B

GATE-COUPLED STRUCTURE FOR ENHANCED ESD INPUT/OUTPUT PAD PROTECTION IN CMOS ICS

FIELD OF THE INVENTION

This invention relates to integrated circuits and in particular to electrostatic discharge protection thereof.

BACKGROUND TO THE INVENTION

Integrated circuits (ICs) can be severely damaged by conducting discharge current of electrostatic charges through the circuits. Protection circuits are typically used to discharge the charges (which appear at input and/or output pads of the circuits), and are typically integrated into the ICs.

Designing protection circuitry involves providing efficient ESD discharging paths between all pad combinations. To achieve that effectiveness each pad requires typically dedicated protection circuitry.

Protection of input pads becomes very difficult in deep submicron complementary metal oxide silicon (CMOS) technologies. The problem comes from the fact that deep submicron processes use very thin oxides (thickness below 10 nm) with low breakdown voltages, below 10V. In order to serve as a useful protection device against an ESD event, its threshold voltage has to be lowered below the oxide breakdown voltage.

A typical circuit used for input pad ESD protection is shown in FIG. 1A. It consists of a grounded gate N-MOS transistor M1 having its drain terminal connected to the IC pad, its source and substrate to Vss and its gate to Vss. During normal IC operation the M1 transistor is off. The M1 transistor is a large geometry MOS transistor intended as the ESD discharge path between the protected pad and Vss terminal.

Under ESD stress condition, when the input pad is stressed negative in respect to the ground (Vss), the drain-substrate junction of the M1 transistor becomes forward biased and conducts the discharge current to the Vss. When the input pad is stressed positive in respect to the ground, the dominant current conduction path involves a parasitic bipolar transistor operating in the snapback region.

For ESD event in respect to Vdd, a p-channel MOS transistor M2 with its gate shorted to Vdd can be connected between the protected pad and Vdd, with its function similar to that of M1 transistor, as shown in FIG. 1B.

The snapback phenomenon in the MOS transistor involves the parasitic bipolar transistor action that takes place when its drain pin is stressed positive respect to ground as shown in FIGS. 2A and 2B, wherein FIG. 2A shows the breakdown and snapback and FIG. 2B shows the parasitic bipolar transistor in the IC involving the FET and its substrate. Increased current conduction in the snapback region is initiated by an avalanche breakdown of the drain-substrate junction of the M1 transistor that usually occurs in the 12V–15V range. This voltage is too high a voltage for most submicron CMOS technologies, in which the typical breakdown voltage of gate oxide is smaller than 12V–15V. Therefore it is important for effective ESD protection, to decrease the snapback voltage to a value lower than the breakdown voltage of the gate oxide.

Since grounded-gate multifinger N-channel MOS devices as shown in FIG. 1A are known to have a broad ESD failure-threshold distribution, an improved gate-coupled structure uses an additional transistor (M2 in FIG. 3) connected between the gate of the N-channel pull-down transistor M1 and the Vss pin. The M2 MOS transistor is a small NMOS transistor which is always on during normal circuit operation. Its function is to turn off the M1 transistor by discharging its gate to ground.

During a positive high voltage ESD pulse the gate of the M1 transistor is biased positively due to a capacitive divider created by transistors M1 and M2. Typical voltage at the FET M1 transistor gate is about 1V, the exact value depending on process conditions (gate-drain overlap capacitance) and transistor sizing. This voltage opens the M1 transistor for conduction during ESD transient and initiates snapback more easily as compared to the grounded gate case. It is widely recognized in practice that this solution provides more uniform finger switching than a grounded gate scheme.

Similar protection configuration can be applied for P-channel pull-up transistors for the case of high voltage ESD pulses with reference to the Vdd pin. However, effectiveness of this configuration is doubtful since PMOS (pnp) is difficult to be put in a snapback mode.

A more effective solution that has been proposed for ESD protection of input/output pads involves using a semiconductor controlled rectifier (SCR) with a low threshold voltage (typically 8V–12V) connected between the protected pad and the Vss. The problem with this low voltage SCR is that once turned on it can stay in the on state even when a triggering signal vanishes or that it can turn on during normal circuit operation.

SUMMARY OF THE INVENTION

The present invention overcomes the above-described deficiencies of the prior art as applied to thin oxide ICs by providing a low threshold ESD discharge path when the IC is unpowered, and a higher threshold voltage when the IC is powered up. It therefore is a significant improvement over prior art of ESD protection circuits by safeguarding the IC to lower voltage ESD pulses when the IC is not powered up, while safeguarding the IC to a higher ESD threshold when it is powered up so that operation voltages which are above the lower threshold but below the higher threshold will not operate the discharge circuit. When the IC is unpowered it can accumulate electrostatic charges for example during testing, transport, packaging, installation, etc., which is protected by the low threshold of the present invention when unpowered.

The present invention can thus protect thin oxide MOS ICs from ESD at the input pad of the IC, can be manufactured in a standard polysilicon gate CMOS process, does not interfere with normal circuit operation, and occupies a reasonably small chip area.

In accordance with an embodiment of the invention, an electrostatic discharge circuit is comprised of an NMOS FET having its drain connected to a static discharge input node and its source and substrate connected to Vss, and switch apparatus for conducting positive polarity electrostatic current directly to the gate and drain of the NMOS FET thereby turning the NMOS FET into a conducting state, and conducting the current through its source-drain circuit to Vss.

In accordance with another embodiment of the invention, an electrostatic discharge circuit is comprised of a static discharge input node, a first NMOS FET having its drain connected to the input node and its source and substrate connected to Vss, a first CMOS inverter comprising a first PMOS FET and a second NMOS FET having the source and substrate of the first PMOS FET connected to the input node, the drain of the first PMOS FET connected at a junction to the drain of the second NMOS FET, and the source of the second NMOS FET connected to Vss, and the gates of the first PMOS FET and the second NMOS FET connected to Vdd and the junction connected to the gate of the first NMOS FET.

BRIEF INTRODUCTION TO THE DRAWINGS

A better understanding of the invention will be obtained by considering the detailed description below, with reference to the following drawings, in which:

FIGS. 1A and 1B illustrate schematic diagrams of two ESD protection circuits in accordance with the prior art, FIG. 2A is a graph of voltage-current characteristics for an N-channel MOS field effect transistor (FET) showing breakdown under ESD, FIG. 2B is a section of an integrated circuit showing a MOSFET and a parasitic bipolar transistor, FIG. 3 is a schematic diagram of another embodiment of the prior art, FIG. 4 is a schematic diagram of an embodiment of the present invention, FIG. 5 is a schematic diagram of another embodiment of the present invention, FIGS. 6A and 6B are schematic diagrams of the protection circuit of the present invention used at an output and at an input, respectively of an IC, and FIG. 7 is a schematic diagram of another embodiment of the present invention.

DETAILED DESCRIPTION OF EMBODIMENTS OF THE PRESENT INVENTION

Figure 4:
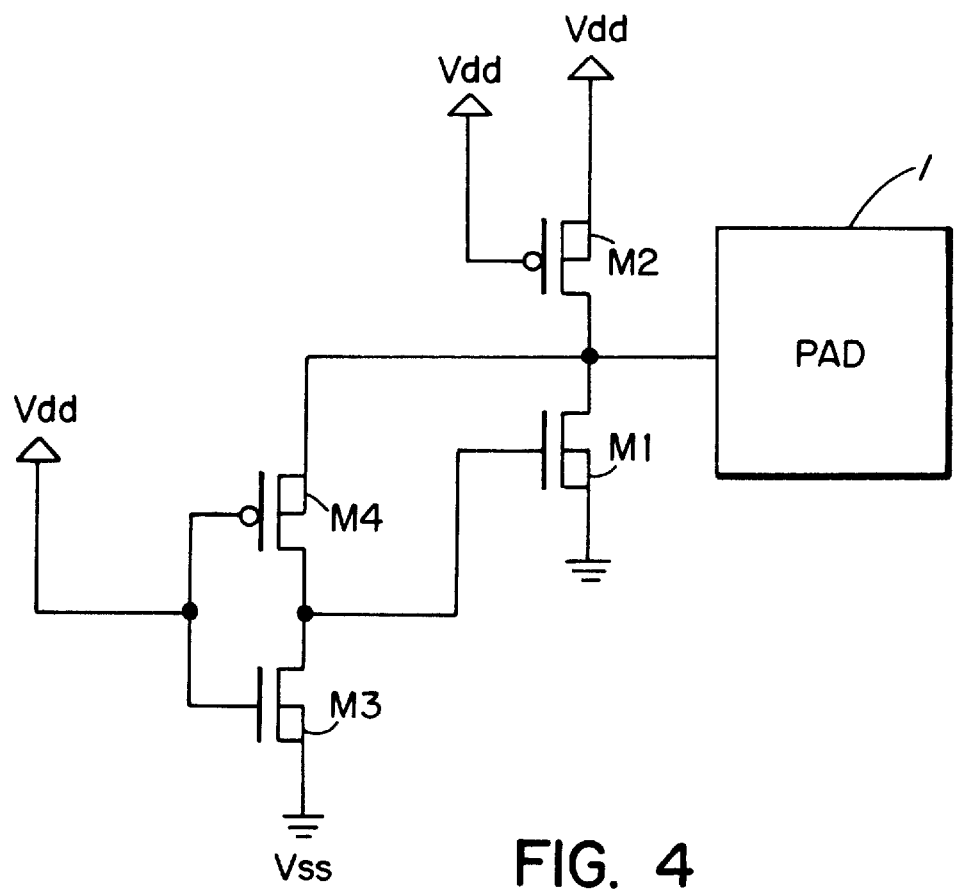

FIG. 4 illustrates an embodiment of the invention.

In the structure shown in FIG. 4, the output of a CMOS inverter comprised of transistors M3 (NMOS) and M4 (PMOS) is connected to the gate of the transistor M1. The input of the inverter is connected to Vss, while the source electrode of the M4 transistor is shorted to the protected pad 1. The transistor M1 provides a discharge path between pad and the Vss for all ESD events in respect to Vss, but its conductance and its snapback voltage are now controlled by the condition of the inverter.

The operation of the structure is as follows. For a negative pad voltage in respect to Vss, the ESD pulse is charged to the p-substrate of the IC and to the corresponding Vss pin through the n-drain/p-substrate diode of the M1 transistor. This mechanism is the same as for most ESD protection structures in industrial practice.

However, a novelty of the invention relates to an ESD discharging mechanism when the pulse is positive, which usually is the most critical ESD condition.

Figure 3:
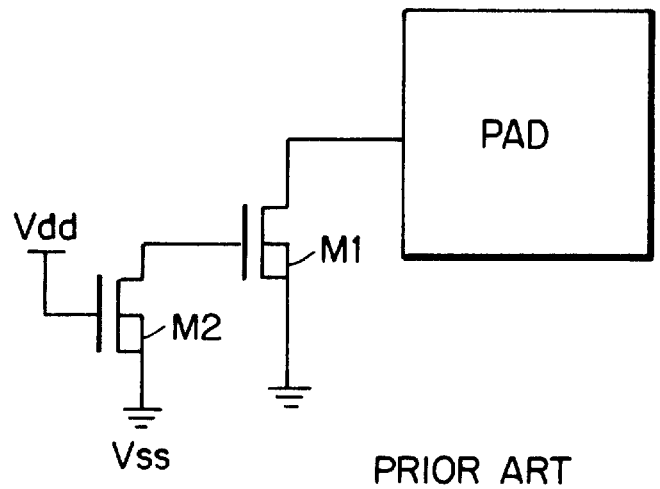

In the case of positive ESD event with respect to Vss, the IC is not powered up (e.g. Vdd is not connected), resulting in the M4 transistor being turned on and the M3 transistor turned off. As the high ESD voltage rises, it is transmitted through the M4 transistor directly to the gate of the M1 transistor, thus turning it on much faster than it would be if its gate were grounded. The rapidly increasing ESD voltage is also applied directly to the drain of the M1 transistor, so the M1 transistor quickly reaches snapback condition. An advantage of circuit shown in FIG. 4 over the one shown in FIG. 3 is that the gate voltage of the M1 transistor is significantly higher during a positive ESD pulse which makes initiation of the snapback much easier.

The abrupt increase of gate-to-source voltage, $V_{GS}$, of the M1 transistor, causes a significant decrease of the breakdown voltage of the drain-substrate junction of the M1 transistor, compared to the $V_{GS}=0V$ condition. This decrease is much greater for MOS transistors with submicron channel lengths, than for MOS transistors with long channels, and may reach even a few volts. Measurements showed, in a laboratory prototype, that by applying only 5V to the gate of the M1 transistor, it is possible to decrease its snapback voltage to 7V, compared to the initial snapback voltage of 11V measured for the $V_{GS}=0V$ condition. Hence, the protection circuit would decrease the snapback voltage of the M1 transistor by almost 50%, bringing it well below the gate oxide breakdown voltage. This decrease will take place only during an ESD event, and during normal IC operation, the snapback voltage of the M1 transistor will be higher than the gate oxide breakdown voltage. Hence, when the IC is not powered up, the structure provides effective ESD protection in the range of voltages smaller than gate oxide breakdown voltages of submicron MOS FET's.

During normal IC operation, Vdd applied to the IC and the M4 transistor of the inverter is turned off, while the M3 transistor is on, shorting effectively the gate of the M1 transistor to Vss. Hence, the M1 transistor and the inverter do not interfere with the normal operation of electronic circuitry connected to the protected input pad.

A similar principle to the one shown in FIG. 4 can be also used to protect the input pad against an ESD pulse applied in respect to Vdd. The circuit shown in FIG. 5 provides enhanced protection of gate oxide in submicron technologies in cases of ESD pulses in respect to both Vss and Vdd.

Figure 5:
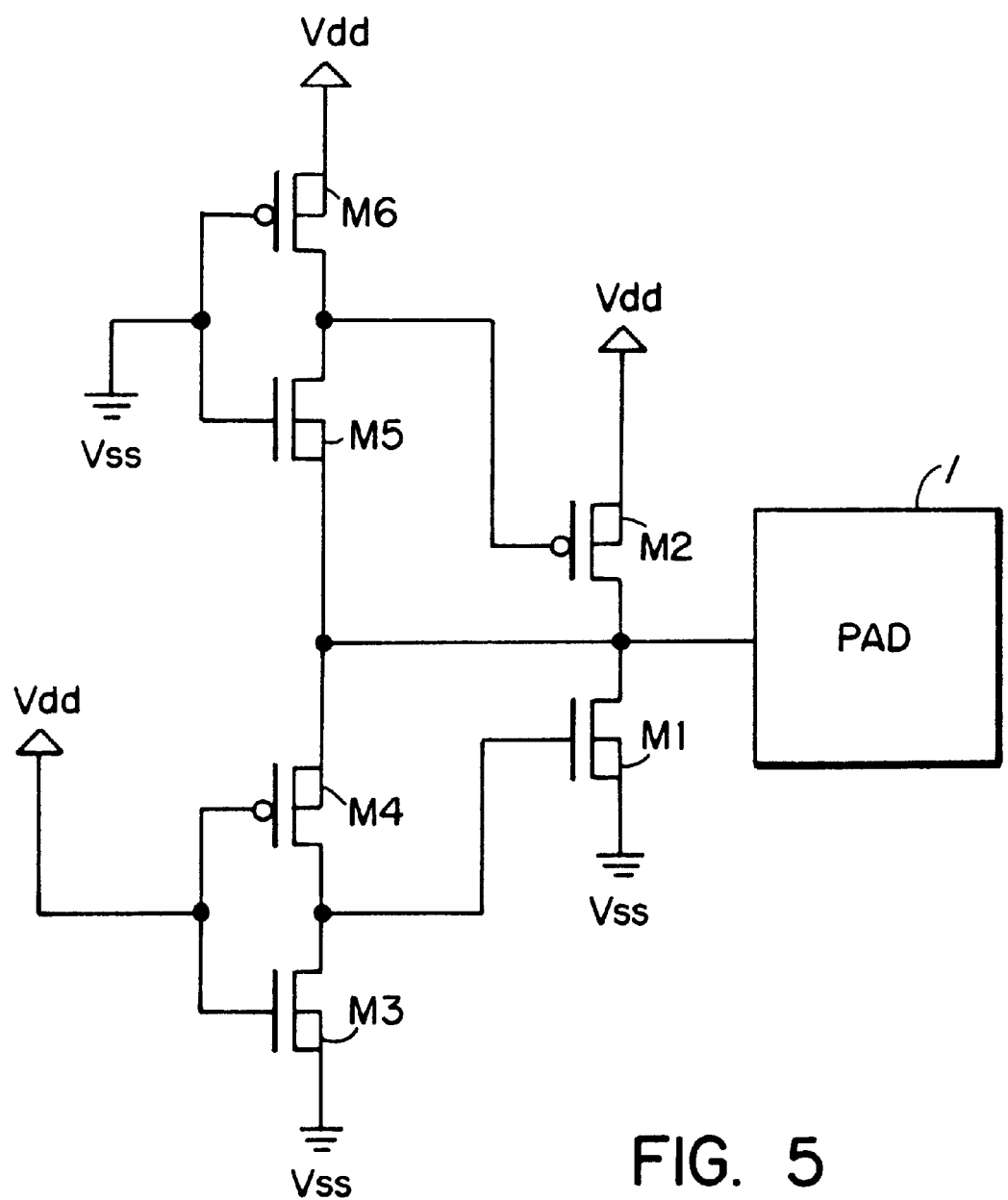

In the embodiment of FIG. 5, a second CMOS inverter comprised of NMOS transistor M5 and PMOS transistor M6 are connected in an analogous manner as the CMOS inverter comprised of transistors M3 and M4, except in this case the junction (output) of the second inverter is connected to the gate of PMOS transistor M2, its input (the gates of transistors M5 and M6) is connected to Vss, the source and substrate of PMOS transistor M6 is connected to Vdd, and the source and substrate of NMOS transistor M5 is connected to the pad 1 to be protected.

Circuit operation in the case of an ESD pulse in respect to Vss is the same as described above, because the inverter consisting of the M5 and M6 transistors effectively keeps the M2 transistor shut off.

The operation of the proposed structure in the case of ESD pulse in respect to Vdd is as follows. For positive pad voltage in respect to Vdd, the ESD pulse is charged to the n-well and corresponding Vdd pin through the p-drain/n-well diode of the M2 transistor. This mechanism is the same as for most ESD protection structures in industrial practice. A novelty of invention involve the ESD discharging mechanism when the ESD pulse is negative.

In the case of negative ESD event in respect to Vdd, the IC is not powered up (Vss not connected), resulting in the M5 transistor turned on and the M6 transistor off. As the magnitude of the negative ESD voltage rises, it is transmitted through the M5 transistor directly to the gate of the M2 transistor, thus turning it on much faster than it would be in the case of zero gate-to-source bias at its gate. The rapidly increasing magnitude of the negative ESD voltage is also applied directly to the drain of the M2 transistor, so the M2 transistor quickly reaches the snapback condition.

The abrupt increase of negative gate-to-source voltage, $V_{GS}$, of the M2 transistor, causes a significant decrease of the breakdown voltage of the drain-substrate junction of the M2 transistor, compared to the $V_{GS}=0V$ condition. It appears that the snapback voltage of the M2 transistor can be reduced to a value well below the gate oxide breakdown voltage. This decrease will take place only during an ESD event, and during normal IC operation the snapback voltage of the M2 transistor will be higher than the gate oxide breakdown voltage. Hence, when the IC is not powered up, the proposed structure provides effective ESD protection in the range of voltages smaller than gate oxide breakdown voltages of submicron MOS FET's.

During normal IC operation the Vdd is connected and the M5 transistor of the inverter is turned off, while the M6 transistor is on, effectively shorting the gate of the M2 transistor to Vdd. Hence, the M2 transistor and its inverter do not interfere with the normal operation of electronic circuitry connected to the protected input pad.

The ESD protection circuits shown in FIGS. 4 and 5 can be used to protect both input and output pads. Typical connection of the ESD protection circuitry for input and output pads is shown in FIGS. 6A and 6B.

Figure 6A:
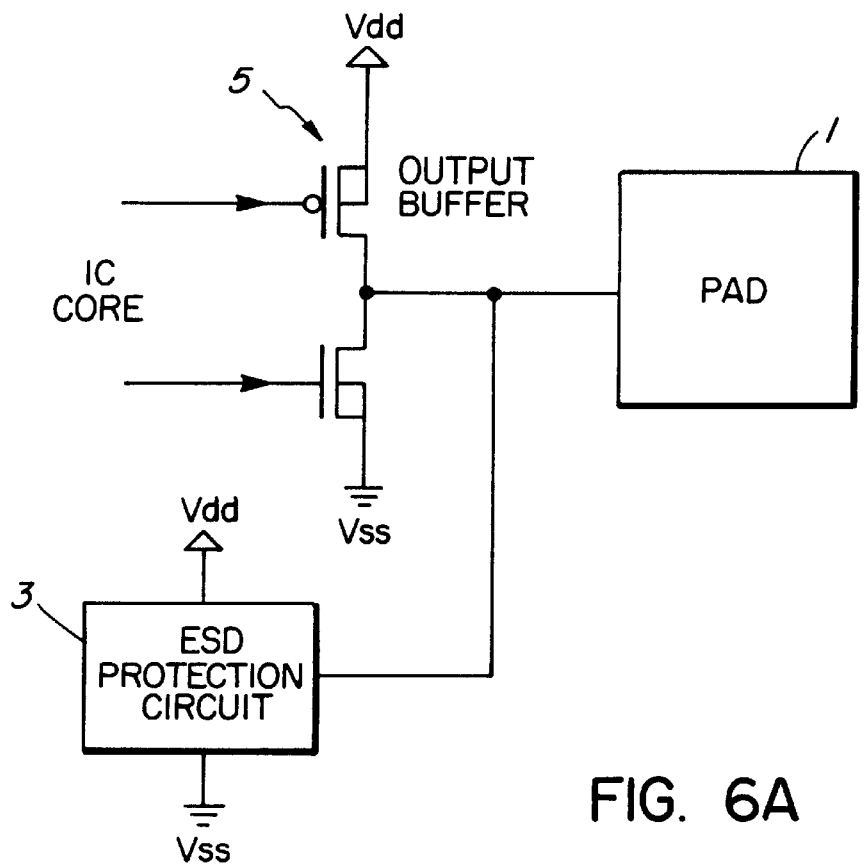
Figure 6B:
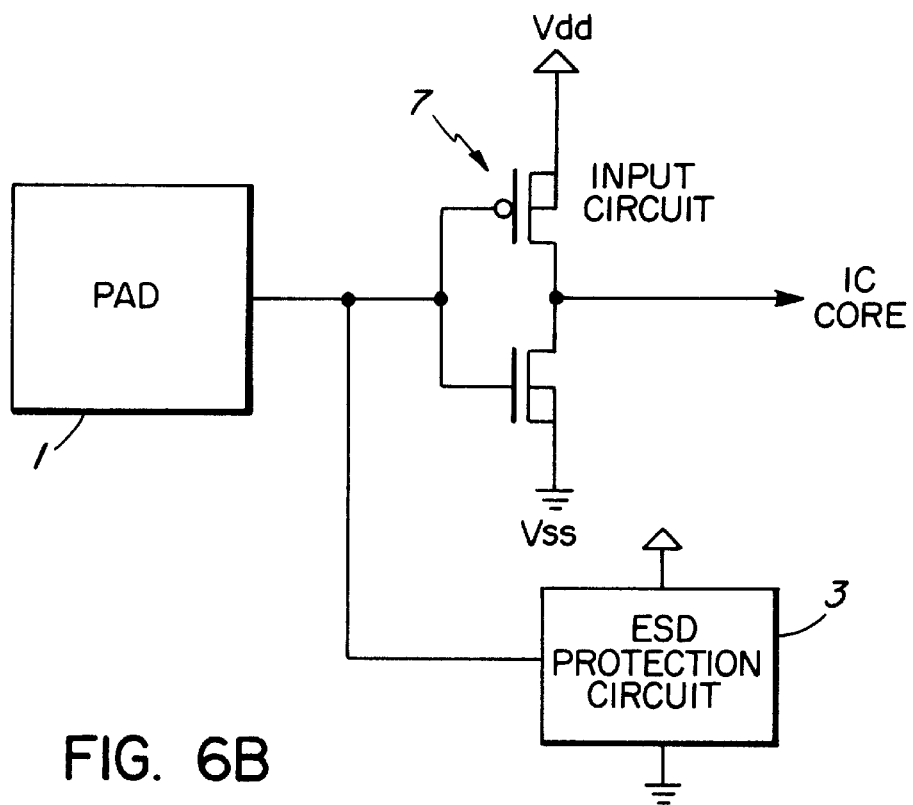

FIG. 6A illustrates an ESD protection circuit 3 in accordance with the present invention connected to the output of an output buffer 5 which forms a final stage of an IC (IC CORE), and which is connected to pad 1. FIG. 6B illustrates an ESD protection circuit 3 in accordance with the present invention connected to the input of an input circuit 7 which forms a first stage (e.g. an input inverter) of an IC (IC CORE), and which input is connected to pad 1. The ESD protection circuit operates as described above.

Figure 7:
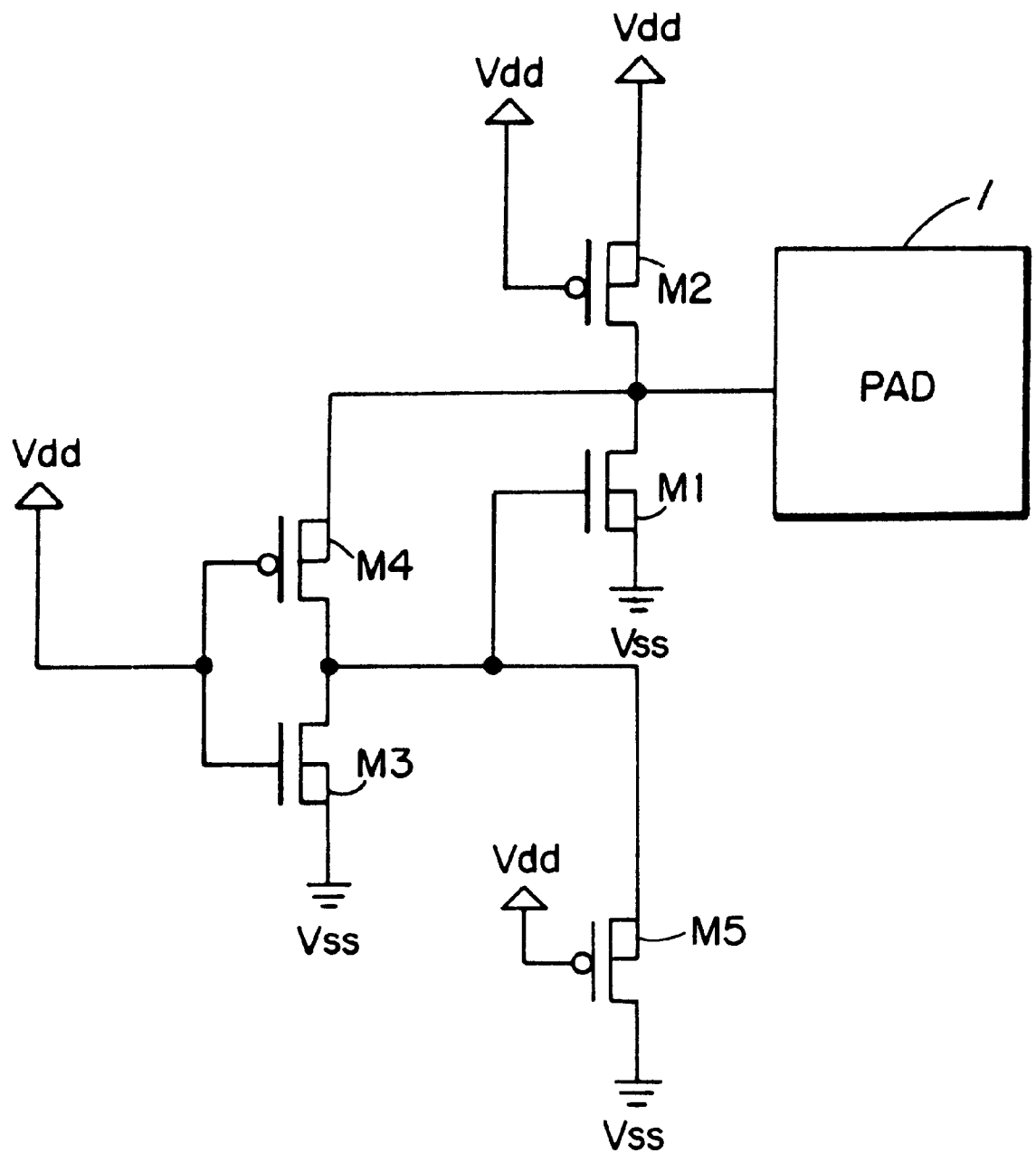

FIG. 7 illustrates another embodiment of the invention. In this case, the structure is as described above with respect to the embodiment of FIG. 4, but utilizes an extra P-channel MOS transistor M5 connected in the normally-off condition (its gate connected to Vdd) between the gate of the N-channel pull-down MOS transistor M1 and the Vss pin.

During the positive ESD pulse with reference to Vss, transistors M4 and M5 become turned on, constituting a non-linear voltage divider that sets up the gate voltage of the transistor M1, operating in the snapback condition. The transistors M4 and M5 should be sized to limit the gate voltage of the M1 transistor to a value lower than the gate oxide breakdown voltage during ESD discharge.

This configuration can be used if the Charge Device Model (CDM) ESD event is of concern. CDM is characterized by much shorter transients than the Human Body Model (HBM). Due to the voltage divider in FIG. 7 not all pad voltage is applied directly to the M1 gate, but only its controlled fraction. This way the M1 gate is protected even if the pulse is very short, such as during CDM discharge.

The embodiment of FIG. 7 can be used with the structure of FIG. 5, in which an NMOS transistor is connected with its source-drain circuit between the gate of transistor M2 and Vdd, and its gate connected to Vss. This NMOS transistor can be used instead of transistor M5, or in addition to transistor M5.

A person understanding this invention may now conceive of alternative structures and embodiments or variations of the above. All those which fall within the scope of the claims appended hereto are considered to be part of the present invention.

We claim:

1. An electrostatic discharge protection circuit comprising a static discharge input node, a first NMOS FET having its drain connected to said input node and its source and substrate connected to Vss, a first CMOS inverter comprised of a first PMOS FET and a second NMOS FET having the source and substrate of the first PMOS FET connected to said input node, the drain of the first PMOS FET connected at a junction to the drain of the second NMOS FET, and the source of the second NMOS FET connected to Vss, and the gates of the first PMOS FET and of the second NMOS FET connected to Vdd and said junction connected to the gate of the first NMOS FET, a second PMOS FET having its drain connected to said input node and its source, substrate and gate connected to Vdd, a second CMOS inverter comprised of a third NMOS FET and a third PMOS FET, the source and substrate of the third NMOS FET connected to said input node, the source and substrate of the third PMOS FET being connected to Vdd, the drains of the third PMOS FET and of the third NMOS FET being connected at a junction to the gate of the second PMOS FET, and the gates of the third PMOS FET and of the third NMOS FET being connected to Vss.

2. A circuit as defined in claim 1, in which the first and second inverters form first legs of respective first and second voltage dividers, a second leg of the first voltage divider is formed of a PMOS FET having its source and substrate connected to the gate of the first NMOS FET, its drain connected to Vss and its gate connected to Vdd, and in which a second leg of the second voltage divider is formed of an NMOS FET having its source and substrate connected to the gate of the first PMOS FET, its drain connected to Vdd and its gate connected to Vss.

3. An electrostatic discharge protection circuit comprising a static discharge input node, a first NMOS FET having its drain connected to said input node and its source and substrate connected to Vss, a first CMOS inverter comprised of a first PMOS FET and a second NMOS FET having the source and substrate of the first PMOS FET connected to said input node, the drain of the first PMOS FET connected at a junction to the drain of the second NMOS FET, and the source of the second NMOS FET connected to Vss, and the gates of the first PMOS FET and of the second NMOS FET connected to Vdd and said junction connected to the gate of the first NMOS FET, a second PMOS FET having its drain connected to said input node and its source, substrate and gate connected to Vdd, further including a voltage divider circuit connected to the gate of the first NMOS FET.

4. A circuit as defined in claim 3 in which the inverter forms one leg of the voltage divider, and a second leg of the voltage divider is formed of a PMOS FET having its source and substrate connected to the gate of the first NMOS FET, its drain connected to Vss and its gate connected to Vdd.

5. An electrostatic discharge circuit comprising a static discharge input node, a first PMOS FET having its drain connected to said input node and its source and substrate connected to Vdd, a first CMOS inverter comprised of a first NMOS FET and a second PMOS FET having the source and substrate of the first NMOS FET connected to said input node, the drain of the first NMOS FET connected at a junction to the drain of the second PMOS FET, and the source of the second PMOS FET connected to Vdd, and the gates of the first NMOS FET and the second PMOS FET connected to Vss and said junction connected to the gate of the first PMOS FET, a second NMOS FET having its drain connected to said input node and its source, substrate and gate connected to Vss, including a voltage divider circuit connected to the gate of the first PMOS FET.

6. A circuit as defined in claim 5 in which the inverter forms one leg of the voltage divider, and a second leg of the voltage divider is formed of an NMOS FET having its source and substrate connected to the gate of the first PMOS FET, its drain connected to Vdd and its gate connected to Vss.

7. An electrostatic discharge circuit comprising an NMOS FET having its drain connected to a static discharge input node and its source and substrate connected to Vss, and first switch means for conducting positive polarity electrostatic current directly to the gate and drain of the NMOS FET thereby turning the NMOS FET into a conducting state, conducting said current through its source-drain circuit to Vss, the switch means comprising a PMOS FET of a first CMOS inverter, the PMOS FET having its gate connected to Vdd, the source and substrate of the PMOS FET being connected to said input node, and the source and substrate of the NMOS FET of the inverter being connected to Vss, and further comprising a second PMOS FET having its drain connected to a static discharge input node and its source and substrate connected to Vdd, and second switch means for conducting positive polarity electrostatic current directly to the gate and drain of the second PMOS FET thereby turning the PMOS FET into a conducting state, conducting said current through its source-drain circuit to Vdd, and in which the second switch means is a second NMOS FET of a second CMOS inverter, the second NMOS FET having its gate connected to Vss, the source and substrate of the second NMOS FET being connected to said input node, and the source and substrate of the second PMOS FET of the second inverter being connected to Vdd.

\* \* \* \* \*